United States Patent [19]

Bouldin et al.

[11] Patent Number: 4,481,046

[45] Date of Patent: Nov. 6, 1984

[54] METHOD FOR MAKING DIFFUSIONS INTO A SUBSTRATE AND ELECTRICAL CONNECTIONS THERETO USING SILICON CONTAINING RARE EARTH HEXABORIDE MATERIALS

[75] Inventors: Dennis P. Bouldin, Essex Junction; Dale P. Hallock, Bristol; Stanley Roberts, South Burlington; James G. Ryan, Essex Junction, all of Vt.

[73] Assignee: International Business Machines Corporation, Armonk, N.Y.

[21] Appl. No.: 537,124

[22] Filed: Sep. 29, 1983

[51] Int. Cl.³ .................... H01L 21/225; H01L 21/28
[52] U.S. Cl. .................................... 148/188; 148/187; 29/591
[58] Field of Search .................. 148/188, 187; 29/589, 29/590, 591

[56] References Cited

U.S. PATENT DOCUMENTS

| | | | |
|---|---|---|---|
| 3,340,108 | 9/1967 | Vickery | 148/33 |
| 3,601,888 | 8/1971 | Engeler et al. | 29/578 |
| 3,887,993 | 6/1975 | Okada et al. | 29/571 |
| 4,180,596 | 12/1979 | Crowder et al. | 427/42 |
| 4,227,944 | 10/1980 | Brown et al. | 148/6 |
| 4,285,761 | 8/1981 | Fatula et al. | 156/628 |
| 4,329,706 | 5/1982 | Crowder et al. | 357/71 |
| 4,364,166 | 12/1982 | Crowder et al. | 29/571 |
| 4,378,628 | 4/1983 | Levinstein et al. | 29/571 |
| 4,389,255 | 6/1983 | Chen et al. | 148/1.5 |

FOREIGN PATENT DOCUMENTS 033336 10/1981 Japan .

OTHER PUBLICATIONS

V. L. Rideout, "Reducing the Sheet Resistance of Polysilicon Lines in Integrated Circuits", Published in IBM TDB, vol. 17, No. 6, Nov. 1974, pp. 1831-1833.

Primary Examiner—Brian E. Hearn
Assistant Examiner—Alan E. Schiavelli
Attorney, Agent, or Firm—George Tacticos

[57] ABSTRACT

A method for diffusing a conductivity determining impurity in a semiconductor substrate and making electrical contact thereto by depositing a conductive layer made of a rare earth hexaboride material containing a predetermined amount of silicon in it over a surface portion of the substrate and heating the substrate for a predetermined period of time at a predetermined temperature which is sufficient to cause boron from the hexaboride material to diffuse into the adjoining portion of the substrate to modify its conductor characteristics. At the same time a good electrical ohmic contact is established between the conductive layer and the adjoining substrate portion while the conductive layer retains its conductivity even after the outdiffusion of some of its boron into the substrate during the heat treatment. A silicon dioxide layer is also formed on the exposed surface of the silicon containing hexaboride material through the oxidation of the silicon disposed close to the exposed surfaces of the hexaboride material.

14 Claims, 5 Drawing Figures

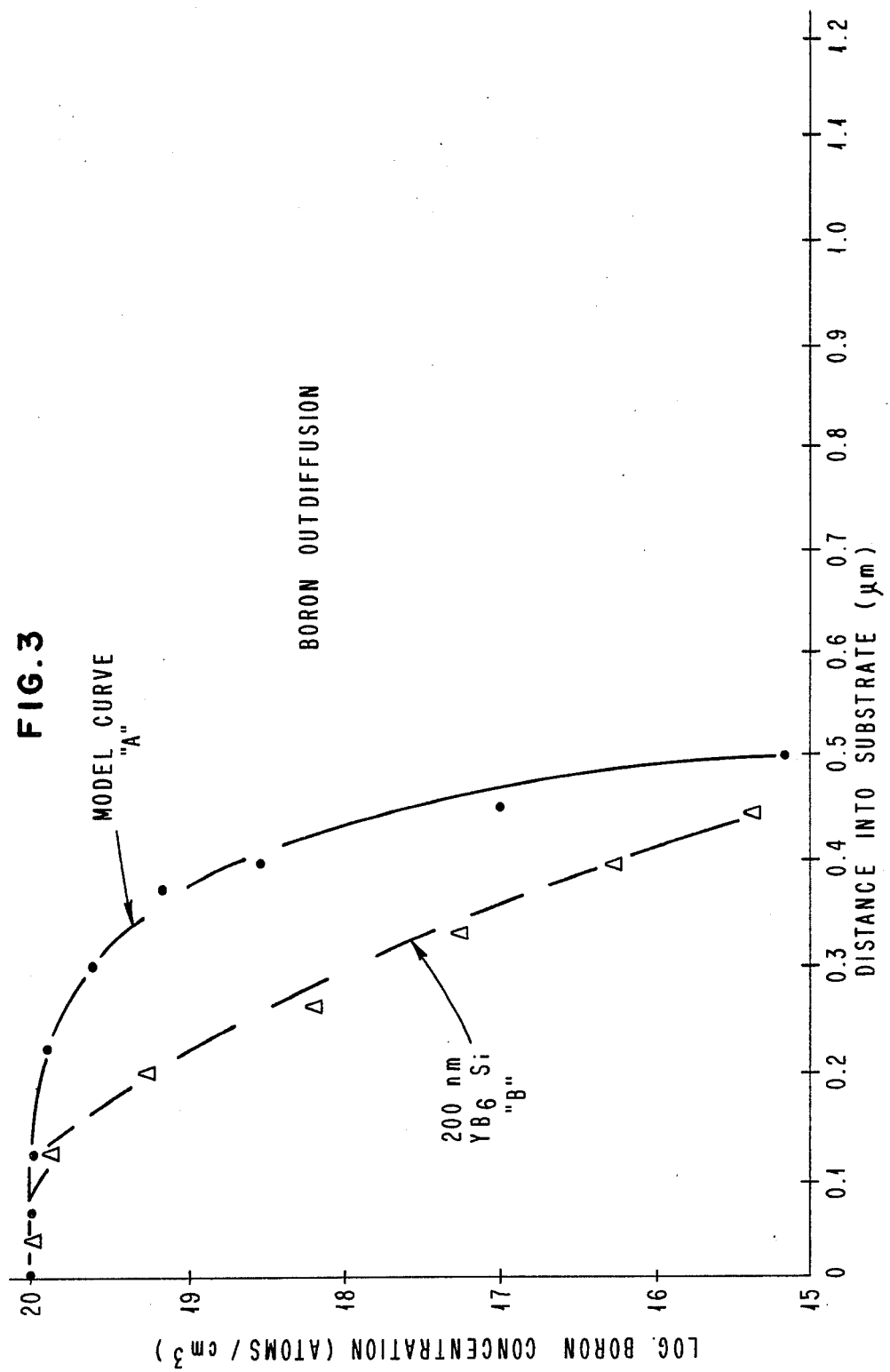

METHOD FOR MAKING DIFFUSIONS INTO A SUBSTRATE AND ELECTRICAL CONNECTIONS THERETO USING SILICON CONTAINING RARE EARTH HEXABORIDE MATERIALS

DESCRIPTION

Field of the Invention

The present invention relates in general to methods for making semiconductor structures and in particular to methods for diffusing conductivity determining impurities into predetermined regions of a substrate and making electrical connections thereto.

RELATED APPLICATION

In a co-pending U.S. patent application Ser. No. 537,128, filed on Sept. 29, 1983, entitled "Method for Making Diffusions Into A Substrate and Electrical Connections Thereto Using Silicon Containing Rare Earth Boride Materials" by Ishaq et al and assigned to the same assignee as the present application, there is disclosed and claimed a method for making diffusions into a substrate and electrical connections thereto using a rare earth boride material.

BACKGROUND

In the prior art, metals (such as aluminum) and polycrystalline silicon (hereinafter referred to as "polysilicon") have been used as materials for interconnecting conductors in semiconductor devices. Polysilicon is often preferrable in many such applications because of its stability at high temperatures and because silicon dioxide can be deposited (through chemical vapor deposition processes) or thermally grown thereon. One of the undesirable features of polysilicon is its relatively high electrical resistance. In order to overcome this problem, polysilicon has been replaced for many of these applications with silicides of certain metals, such as molybdenum, tantalum, tungsten, rhodium and mixtures thereof. An article by V. L. Rideout entitled "Reducing the Sheet Resistance of Polysilicon Lines in Integrated Circuits" and published in IBM Technical Disclosure Bulletin, Volume 17, No. 6, November 1974, teaches the use of hafnium silicide as a conductive material in the place of polysilicon for the purpose of decreasing the resistance of these conductors. U.S. Pat. No. 4,180,596 issued on Dec. 25, 1979 to Billy L. Crowder and Stanley Zirinsky, entitled "Method for Providing a Metal Silicide Layer on a Substrate" and assigned to the present assignee, describes a method for providing a metal silicide on a semiconductor substrate, using a refractory metal, such as from the group consisting of molybdenum, tantalum, tungsten, rhodium and mixtures thereof.

In the prior art some conductive lines made of metals or polysilicon have been used as sources for doping materials for the formation of doped regions in semiconductor devices. For example, U.S. Pat. No. 3,601,888 entitled "Semiconductor Fabrication Technique and Devices Formed Thereby Utilizing a Doped Metal Conductor" and issued on Aug. 31, 1971 to W. E. Engeler et al. teaches the use of a metal conductor made of a material such as molybdenum, doped with a conductivity determining impurity, such as boron, for use as a diffusion source and then as an electrode for the diffused region. U.S. Pat. No. 3,887,993, entitled "Method of Making an Ohmic Contact With a Semiconductor Substrate" and issued on June 10, 1975 to T. Okada et al. also discloses the use of a metal, such as tungsten, platinum or molybdenum which is doped with a conductivity determining impurity such as arsenic, boron, phosphorous or antimony to form diffusion regions in semiconductor substrates. Using a heat treatment the doping material is diffused in the semiconductor regions while the metal reacts with the semiconductor regions to form low resistivity ohmic contacts. This patent further suggests the use of two doping materials of opposite conductivity type on different portions of a metal line to form N-type and P-type diffusions on different regions of the substrate during the same diffusion steps.

U.S. Pat. No. 4,364,166 entitled "Semiconductor Integrated Circuit Interconnections", issued on Dec. 21, 1982 to Crowder et al. and assigned to the present assignee, discloses inter alia, the use of a composite structure of polysilicon and a metal silicide (hereinafter referred to as "polycide") on a substrate, with the polysilicon of the polycide doped with a material that outdiffuses into predetermined regions of the substrate during a heating cycle to make them conductive.

DISCLOSURE OF THE INVENTION

It is an object of this invention to provide a new and improved method for making doped regions in a semiconductor substrate from dopant materials that outdiffuse from an adjacent interconnecting conductive line and for forming ohmic contacts between the conductive line and these doped regions.

It is another object of this invention to provide a method for forming a conductive line on a semiconductor substrate that is stable during high temperature processing, it can oxidize and it contains in it a conductivity determining material a portion of which can outdiffuse into adjacent portions of the substrate to form diffusion regions without diminishing the conductivity of the conductive line.

It is still another object of this invention to provide a material and a method for using it to form an interconnecting conductive line from which dopants can be made to outdiffuse into predetermined regions of an adjoining substrate and to form ohmic contacts between these regions and the conductive line, wherein the material of the conductive line has a low work function, a low barrier height, low resistivity, the ability to oxidize at a predetermined oxidation ambient and a high corrosion resistance to chemicals used in subsequent processing steps.

It is yet another object of this invention to provide a method for forming a conductor on a semiconductor substrate that can serve as a self-aligned diffusion source for the formation of doped regions in the substrate and which conductor contains sufficient silicon for the formation of a silicon dioxide layer on its exposed surfaces during its high temperature processing.

In accordance with the teachings of this invention, a method is provided for diffusing a conductivity determining impurity in a semiconductor substrate which includes depositing a conductive layer of a rare earth hexaboride material containing a predetermined amount of silicon in it over a surface portion of the substrate. The substrate is then heated for a predetermined period of time at a predetermined temperature which is sufficient to cause boron from the boride material to diffuse into the adjacent portion of the substrate so as to modify the conduction characteristics of this portion and to form an electrical ohmic contact between the conductive layer and the substrate portion. Since boron is a P-type dopant material, its effects on the semiconductor portion into which it diffuses is to make the material into a region of a P-type conductivity, or if the material is already P-type to give it an even higher P-type conductivity. A silicon dioxide layer is also formed on the exposed surfaces of the silicon containing rare earth hexaboride material through the oxidation of the silicon disposed close to the exposed surfaces of the boride material.

In one embodiment of this invention the substrate is covered with an electrically insulating material which is patterned to have openings exposing the portions of the substrate which are to be doped into P-type regions of a specified conductivity level. A rare earth hexaboride, such as, for example, an yttrium hexaboride containing a preselected amount of silicon is deposited over the insulating layer and through its openings onto the exposed surface portions of the substrate. Although the addition of silicon into a conductive mixture is normally expected to lower the overall conductivity of the material, it was found that the addition of small amounts of silicon into certain rare earth hexaboride materials, such as for example $LaB_6$, not only does not lower their conductivity, but in certain cases it increases the conductivity of the mixture.

One advantage of the present invention is that it provides refractory interconnections which have good electrical conductivity and can easily be formed using conventional dual electron-beam evaporation techniques or sputtering from either a compound source or co-sputtering from a metal, silicon and a boron target.

Another advantage of the present invention is that it provides a conductive line having low work function, low barrier height and high corrosion resistance to process chemicals (such as alkaline or acidic cleaning solutions).

A further advantage of this invention is in that it provides for the doping of semiconductor regions with boron which outdiffuses from an adjacent conductive line without substantially affecting the conduction characteristics of the line. Furthermore since boron is a part of the composite boride material used to make the conductive line, it does not have to be introduced into the line material through additional doping processes.

Another advantage of this invention is that it provides for the interconnection material the capability to form a silicon dioxide layer on its exposed surface from the oxidation of some of the silicon contained in it. This oxidation may be accomplished during the heating cycle for the formation of the diffusion in the substrate.

The above noted advantages make the invention useful for many applications of conductive lines for interconnecting doped regions of CMOS structures. The low work function of rare earth hexaboride materials combined with their high conductivity, their ability to outdiffuse boron for the formation of P-type diffusions without any significant reduction in conductivity and their ability to form a silicon dioxide layer on their exposed surfaces make them superior to many other materials heretofore used for making conductive lines for CMOS structures.

The foregoing and other objects, features and advantages of the invention will become more readily apparent from the following and more particular description of the invention taken in conjunction with the accompanying drawings.

BRIEF DESCRIPTION OF THE DRAWINGS

FIG. 3 is a graphical representation of the boron concentration in a substrate portion as a function of its distance from the surface of the substrate following its outdiffusion from an adjacent rare earth boride conductive line in accordance with the teachings of the present invention.

DETAILED DESCRIPTION OF THE DRAWINGS

Figure 1A:
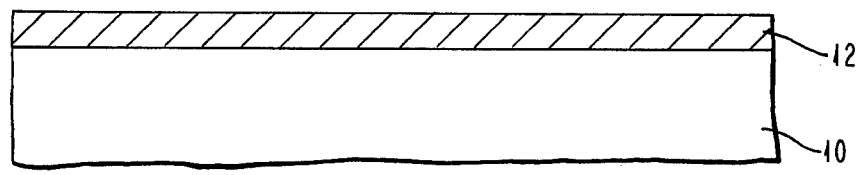
FIGS. 1a through 1c illustrate in diagrammatic cross sectional views three of the most important process steps utilized in fabricating an embodiment of the present invention.
Figure 1B:
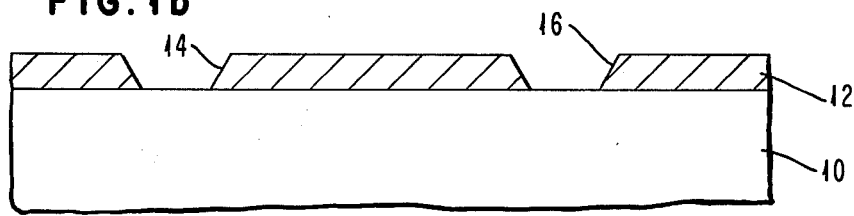

Referring now to FIG. 1a, there is shown a semiconductor body 10, such as a silicon substrate, on which there is an electrically insulating layer 12, which can be silicon dioxide. The insulating layer 12, which may have a thickness of 200 to 500 nm, is patterned by conventional masking and etching techniques to form openings 14 and 16 as shown in FIG. 1b exposing predetermined portions of the underlying surface of the semiconductor substrate 10. Using electron-beam evaporation techniques or sputtering from either a compound source or co-sputtering from a metal and a boron target, a rare earth hexaboride such as a yttrium hexaboride, containing predetermined amounts of silicon, is formed over the patterned insulating layer 12 and into openings 14 and 16 making contact with the exposed surface portions of the underlying semiconductor substrate 10. Although the addition of silicon into a conductive layer normally tends to increase the resistivity of the layer we discovered that a controlled amount of silicon into a rare earth hexaboride structure does not always increase its resistivity. Actually in some cases, the addition of preselected amounts of silicon into certain boride compositions has been found to lower their resistivity.

The structure is then heated for a predetermined period of time at a predetermined temperature so that boron will outdiffuse from the hexaboride layer 18 into portions of the adjacent semiconductor substrate 10 which are in direct contact with the hexaboride layer 18. Regions 20 and 22 are formed from the diffusion of boron from the hexaboride layer 18 into the adjacent portions of the substrate. The temperature level and the heating time depends on the material selected to make layer 18, on the desired boron concentration in the substrate regions and on the desired diffusion depths of regions 20 and 22. For example, if boron is diffused from a $YB_6Si$ layer 18 into silicon at 1000° C., a P-type region approximately 0.85 μm deep is formed in 1 hour.

In TABLE I there are provided the outdiffusion characteristics of films made from yttrium hexaboride containing silicon in it ($YB_6Si$) in accordance with the teachings of this invention. The $YB_6Si$ layer was formed on a silicon substrate through dual electron-beam evaporation techniques. The similarities of vapor pressure for yttrium and silicon allows the controlled evaporation of the three components from a dual electron-beam source. Alternatively, the three components can be evaporated from a three source evaporator. The $YB_6Si$ film had a thickness of about 200 nm and it was exposed to a heat treatment at 1,000° C. in a nitrogen ambient.

TABLE I

| Material | Time (min) | Surface Concentration of Boron ($N_B$) $Log N_B$ | Diffusion Depth ($\mu m$) |
|---|---|---|---|
| $YB_6Si$ | 19 | 20.0 | 0.31 |
| $YB_6Si$ | 45 | 19.5 | 0.45 |
| $YB_6Si$ | 60 | 19.4 | 0.85 |

Figure 1C:
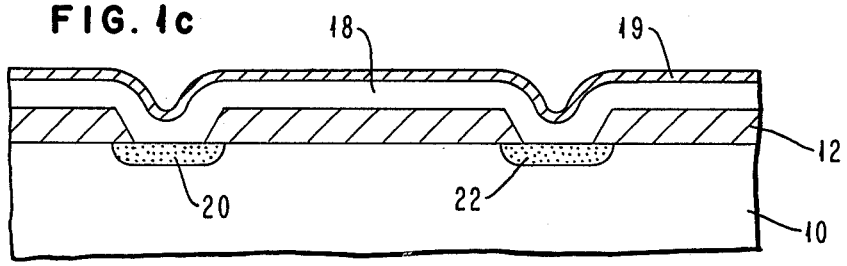

During the heat treatment for the formation of regions 20 and 22, silicon from layer 18 oxidizes and forms a silicon dioxide layer 19 over the exposed surfaces of rare earth hexaboride layer 18. Layer 19, as shown in FIG. 1c, protects the rare earth hexaboride material during the high temperature treatment and at the same time it provides an insulating layer over the conductive layer 18 allowing other interconnection lines to cross it. The protection provided by layer 19 can be further enhanced by forming layer 19 through an additional deposition of silicon on layer 18 and its conversion into silicon dioxide through oxidation. This results in a thicker $SiO_2$ layer which further enhances the reliablility of the structure. Layer 19 may also be made from other oxidation preventing materials that are used as capping layers in conventional semiconductor processes.

Figure 2:
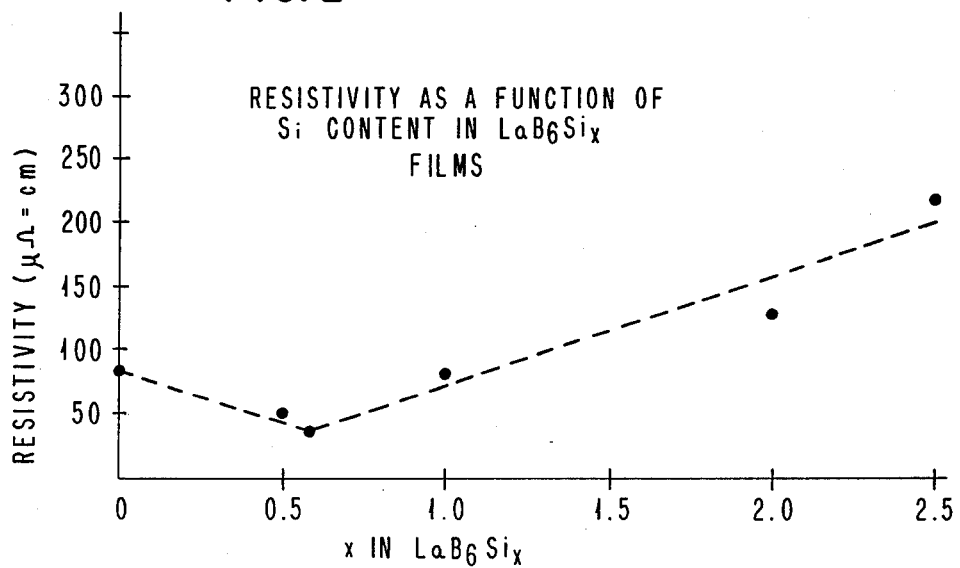
FIG. 2 is a graphical representation of the resistivity of a rare earth hexaboride conductive line containing silicon in it, as a function of its silicon content.

In FIG. 2 there is shown a graphical representation of the resistivity of lanthanum hexaboride films containing silicon, as a function of their silicon content. It shows that the resistivity of these films decreases as the silicon content x in their composition $LaB_6Si_x$ changes from 0.0 to 0.6 (i.e. from $LaB_6$ to $LaB_6Si_{0.6}$) and then it starts to increase again. At x=1 the resistivity of the material is about 60 $\mu\Omega \cdot cm$ which is about the same as with a material with x=0. This means that a lanthanum hexaboride composition without any silicon ($LaB_6$) has about the same resistivity as a material with x=1 wherein there is 1 atom of Si for every atom of La and 6 atoms of B ($LaB_6Si$). Thus, hexaboride material $LaB_6Si$ has about the same resistivity and about the same boron outdiffusing characteristics as $LaB_6$ but it will oxidize much more readily that $LaB_6$ because of its silicon content. In atomic percentages the addition of silicon into $LaB_6$, up to approximately 8%, results in a decrease in the resistivity of the material. However even if the material has a higher silicon content than $LaB_6Si_{0.6}$, the resistivity of the mixture still remains at relatively low levels for a wide range of silicon contents. For example, $LaB_6Si_{1.05}$ has a resistivity which about the same as $LaB_6Si_{0.10}$. Thus the hexaboride layer can be designed to have a preselected amount of silicon to give it the desired conduction and oxidation characteristics. A material having one atom of silicon for every one atom of lanthanum and six atoms of boron ($LaB_6Si_{1.0}$) will have a 12.5% atomic percentage of silicon in it. Materials with an atomic percentage of silicon in the range between 2% and 25% can be made to produce interconnections in accordance with the present invention that will have relatively less resistivity and good oxidation characteristics. In addition to $LaB_6Si_x$ and $YB6Si_x$ other rare earth hexaboride materials are also suitable for use in practicing this invention depending upon the type of the structure needed, the characteristics of the structure (such as the desired conductivity for the conductive line), the remaining processing steps that the structure will be subjected to and the subsequent planned uses of the device.

In FIG. 3 there is shown a graphical representation of boron outdiffusion from semi-infinite sources into a silicon substrate.

Curve A illustrates a simulated profile that results from the diffusion of boron into a P-type silicon structure. The boron concentrations at the silicon surface is about $10^{20}$ atoms/$cm^3$ and the concentration of boron in the P-type silicon substrate is about $10^{15}$ atoms/$cm^3$. The curves of FIG. 3 are showing the logarithm of the boron concentration as a function of the distance from the silicon surface. At 0.5 microns the logarithm of the boron concentration given by this model is 15 which represents a boron concentration of $10^{15}$ atoms/$cm^3$ which is the same as the boron concentration in the P-type substrate prior to the diffusion. Thus the depth of the diffusion in this model curve is 0.5 microns. Curve B illustrates the boron concentration profile which results from the outdiffusion of boron from a 200 nm layer of $YB_6Si$ into a silicon substrate. The results for curve B were obtained through a boron outdiffusion from $YB_6Si$ layer during a heat treatment at about 1000° C. in a $N_2$ ambient for 19 minutes.

It is desirable for the rare earth hexaboride selected to form a conductive line in accordance with the teachings of this invention to have a thermal expansion coefficient that approximates that of the semiconductor and insulating materials used with it in the structure to minimize the thermal stresses applied during the heating and cooling of the structure. Furthermore it must have a high conductivity even while containing predetermined quantities of silicon. It must also have the characteristics of a high temperature refractory material so that it does not melt or alloy with the adjacent semiconductor and insulating materials, it must resist corrosion and it must adhere to the underlying insulating and semiconductor materials.

While the invention has been described in connection with a preferred sequence of process steps used for making a semiconductor structure, it will be understood that the invention is not limited to those particular process steps, their sequence, or the final structures depicted in the drawings. On the contrary, it is intended to cover all alternatives, modifications and equivalents, as may be included within the spirit and scope of the invention as defined by the appended claims.

What is claimed is:

1. A method for diffusing a conductivity determining impurity in a semiconductor substrate and making electrical contact thereto comprising:
    depositing a conductive layer of a rare earth hexaboride material containing a predetermined amount of silicon in it over a predetermined surface portion of said substrate;
    heating said substrate for a predetermined period of time at a predetermined temperature sufficient to cause boron from said hexaboride material to diffuse into said portion of said substrate so as to modify the conduction characteristics of said portion and to establish an electrical ohmic contact between said conductive layer and said substrate portion.

2. A method as set forth in claim 1, wherein silicon from said conductive layer is oxidized during said heating step to form a silicon dioxide layer over the exposed surfaces of said conductive layer.

3. A method as set forth in claim 1 whereing said rare earth hexaboride material is deposited over said substrate portion in a predetermined pattern.

4. A method as set forth in claim 3 wherein said predetermined pattern is formed by forming a layer of an electrically insulating material on a surface of said substrate and then etching away portions of said insulating material to expose portions of said substrate with said exposed portions forming said predetermined pattern.

5. A method as set forth in claim 1 wherein said rare earth hexaboride containing silicon is one selected from the group consisting of: $YB_6Si$, and $LaB_6Si$.

6. A method as set forth in claim 1 wherein said rare earth hexaboride material contains silicon having an atomic percentage in the range between 2 to 25%.

7. A method for making semiconductor devices wherein a conductive layer makes electrical contact with a predetermined region in a semiconductor substrate characterized in that said conductive layer is made of a rare earth hexaboride material containing a predetermined quantity of silicon and in that boron from said conductive material outdiffuses during a heating cycle into said predetermined region so as to modify the conduction characteristics of said region and to establish a low resistance ohmic contact between said conductor layer and said substrate region.

8. A method as set forth in claim 7 which is further characterized in that silicon from certain portions of said conductive layer oxidize during said heating cycle to form a silicon dioxide layer over the exposed surfaces of said conductive layer.

9. A method as set forth in claim 8 wherein said rare earth boride is a rare earth hexaboride selected from the group consisting of $LaB_6$ and $YB_6$.

10. A method for forming an interconnect conductor structure on a semiconductor substrate and forming doped regions in said substrate and electrical contacts between said conductor structure and said doped regions characterized in that said conductor structure comprises a layer of a rare earth earth hexaboride material containing a predetermined amount of silicon in it disposed over portions of said substrate and in direct contact with said substrate over predetermined substrate regions and in that boron from said rare earth hexaboride material outdiffuses during a heating cycle of predetermined time and temperature, from said conductor structure and into said predetermined substrate regions to thereby modify the conductive characteristics of said substrate regions through the addition of this P-type impurity and to establish ohmic electric contacts between said conductor structure and said substrate regions.

11. A method for making semiconductor devices wherein a conductive layer is patterned to make electrical contact with predetermined regions of said devices characterized in that said conductive layer is made of a silicon containing rare earth hexaboride material.

12. A method as set forth in claim 11, which is further characterized by forming an oxidation preventing capping layer over said conductive layer.

13. A method as set forth in claim 12, wherein said oxidation preventing layer is made of silicon.

14. A method as set forth in claim 13, wherein said oxidation preventing layer comprises a layer of silicon covered by a phospho-silicate glass material.

* * * * *